(12) United States Patent
Shimizu

(10) Patent No.: US 7,835,210 B2
(45) Date of Patent: Nov. 16, 2010

(54) MAGNETIC RANDOM ACCESS MEMORY AND DATA READ METHOD OF THE SAME

(75) Inventor: Yuui Shimizu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 706 days.

(21) Appl. No.: 11/846,985

(22) Filed: Aug. 29, 2007

(65) Prior Publication Data

US 2009/0067212 A1  Mar. 12, 2009

(30) Foreign Application Priority Data

Aug. 31, 2006  (JP) ............................. 2006-236724
Aug. 8, 2007  (JP) ............................. 2007-206956

(51) Int. Cl.
*G11C 7/02* (2006.01)

(52) U.S. Cl. .................. 365/210.15; 365/158; 365/171; 365/173; 365/210.1

(58) Field of Classification Search ................ 365/158, 365/171, 173, 210.1, 210.14, 210.15
See application file for complete search history.

(56) References Cited

U.S. PATENT DOCUMENTS

| | | | |
|---|---|---|---|
| 6,697,294 B1 * | 2/2004 | Qi et al. .................. | 365/210.15 |
| 7,116,598 B2 * | 10/2006 | Shimizu et al. ........... | 365/210.1 |
| 7,286,429 B1 * | 10/2007 | Liaw et al. ................ | 365/209 |
| 7,313,043 B2 * | 12/2007 | Gogl et al. ................ | 365/210.1 |
| 7,495,984 B2 * | 2/2009 | Kim et al. ................ | 365/210.1 |

FOREIGN PATENT DOCUMENTS

JP  2004-220759  8/2004

OTHER PUBLICATIONS

W. C. Jeong, et al., "Highly scalable MRAM using field assisted current induced switching", 2005 Symposium on VLSI Technology Digest of Technical Papers, 10B-1, pp. 184-185.
T. Kawahara, et al., "2 Mb Spin-Transfer Torque RAM (SPRAM) with Bit-by-Bit Bidirectional Current Write and Parallelizing-Direction Current Read", ISSCC Digest of Technical Papers, IEEE International Solid-State Circuits Conference, vol. 50, Session 26, ISSN 0193-6530, Feb. 11-15, 2007, pp. 480, 481 and 3 cover pages.

* cited by examiner

*Primary Examiner*—Dang T Nguyen
*Assistant Examiner*—Alexander Sofocleous
(74) *Attorney, Agent, or Firm*—Oblon, Spivak, McClelland, Maier & Neustadt, L.L.P.

(57) ABSTRACT

A magnetic random access memory includes a memory element having a first fixed layer, a first recording layer, and a first nonmagnetic layer, a first reference element having a second fixed layer, a second recording layer, and a second nonmagnetic layer, antiparallel data being written in the first reference element, a second reference element making a pair with the first reference element, and having a third fixed layer, a third recording layer, and a third nonmagnetic layer, parallel data being written in the second reference element, and a current source which, when a read operation is performed, supplies a current from the second fixed layer to the second recording layer in the first reference element, and supplies the current from the third recording layer to the third fixed layer in the second reference element.

20 Claims, 9 Drawing Sheets

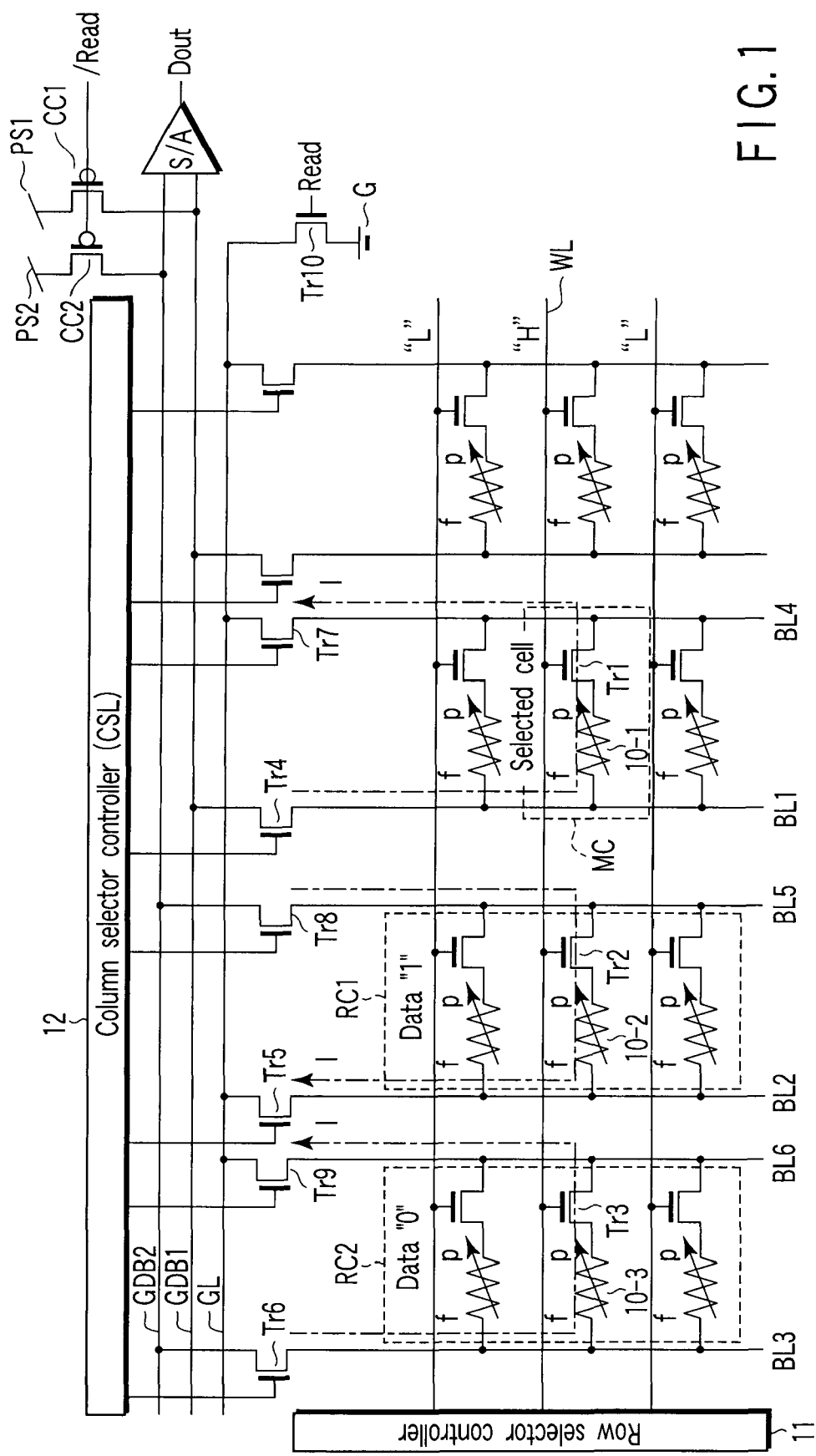
F I G. 1

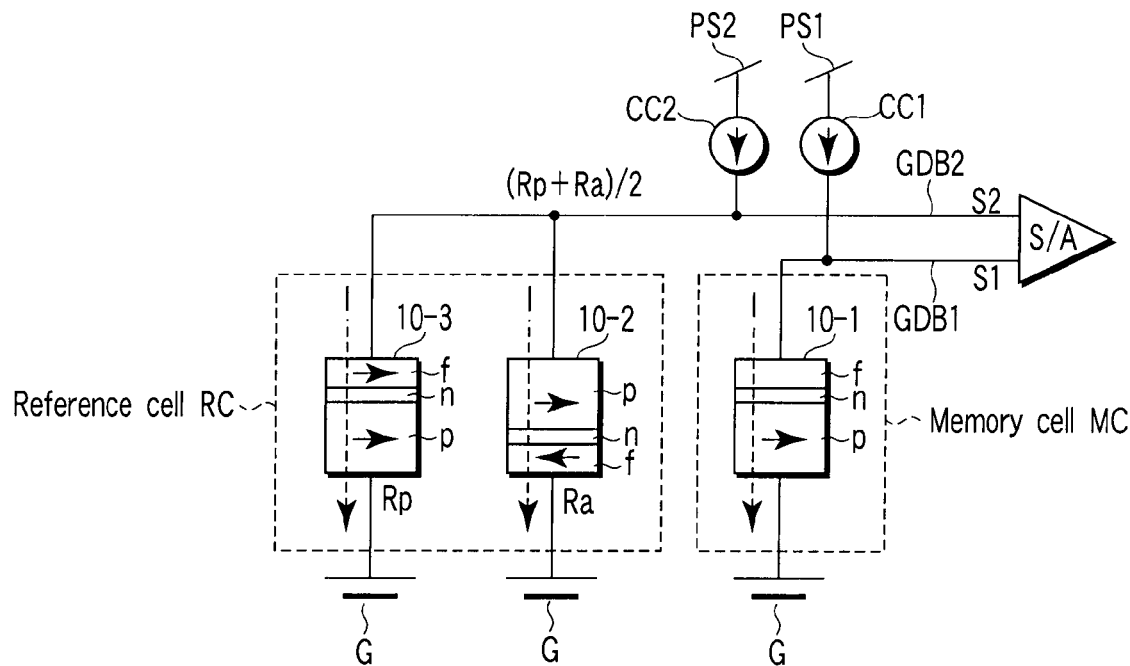
F I G. 2
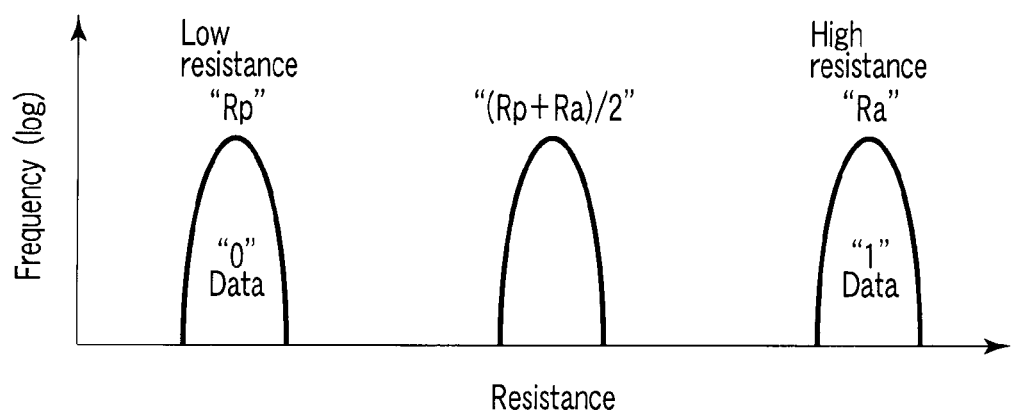
F I G. 3

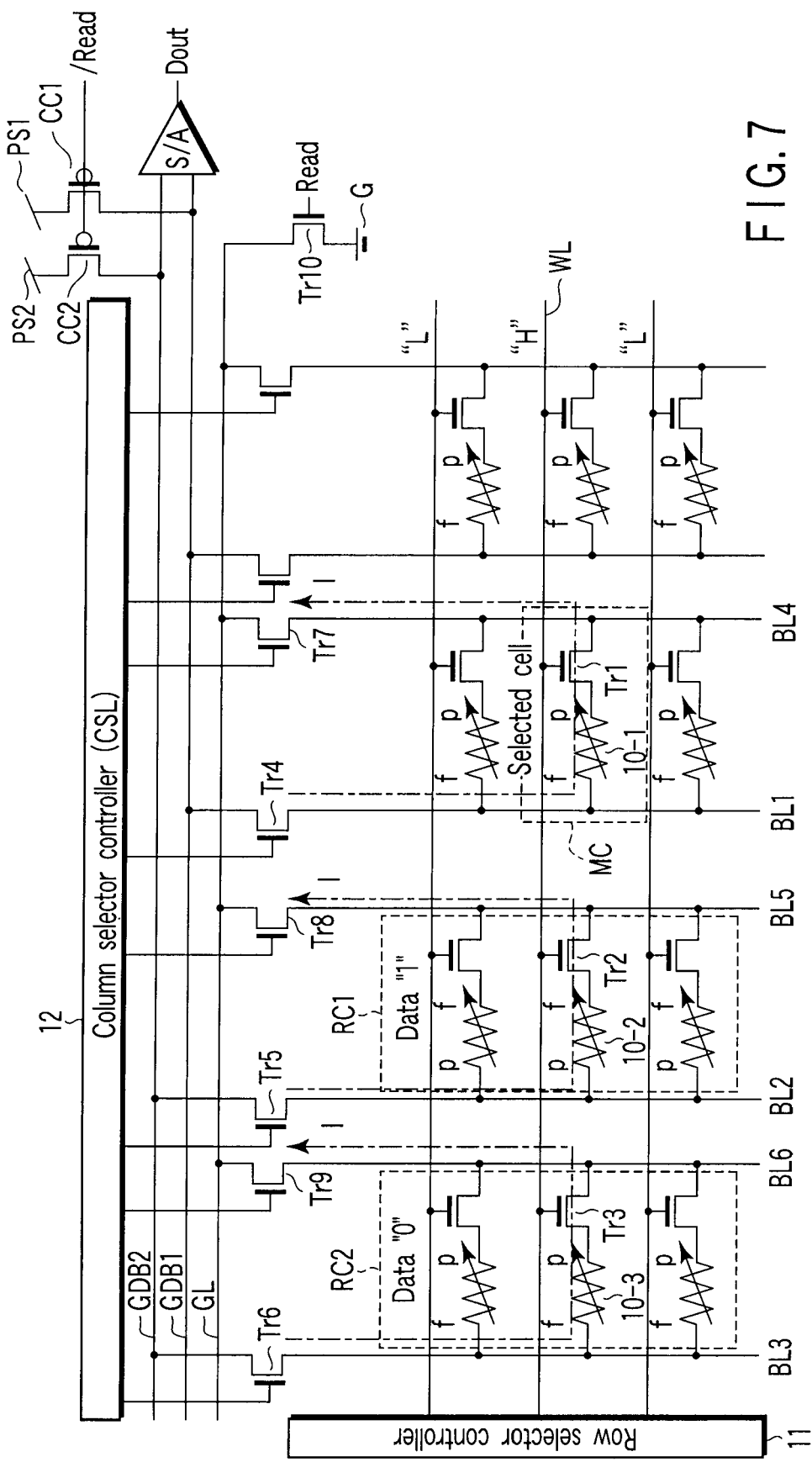
F I G. 7

MAGNETIC RANDOM ACCESS MEMORY AND DATA READ METHOD OF THE SAME

CROSS-REFERENCE TO RELATED APPLICATIONS

This application is based upon and claims the benefit of priority from prior Japanese Patent Applications No. 2006-236724, filed Aug. 31, 2006; and No. 2007-206956, filed Aug. 8, 2007, the entire contents of both of which are incorporated herein by reference.

BACKGROUND OF THE INVENTION

1. Field of the Invention

The present invention relates to a magnetic random access memory using the spin injection technique, a data read method of the same, and a resistance random access memory.

2. Description of the Related Art

While the degree of integration of NAND flash memories is steadily increasing with time, needs for nonvolatile RAMs (Random Access Memories) are still high. Examples of candidates for nonvolatile RAMs presently being developed are an FeRAM (Ferroelectric Random Access Memory) and MRAM (Magnetic Random Access Memory).

Recently, an MRAM using spin injection magnetization reversal as a write method is being developed (e.g., non-patent reference 1). In 1996, Slonczewski and Berger proposed a spin injection technique of reversing magnetization by the direct interaction between conduction electron spins and the magnetic moment by applying a polarized spin electric current to a magnetic cell. It was confirmed that a GMR (Giant Magneto-Resistive) element and TMR (Tunneling Magneto-Resistive) element operated by this technique.

The spin injection technique as described above eliminates the problem of disturbance in a half-selected state, which arises when each cell is made up of one memory cell and one selection element and data is written by using a biaxial current magnetic field. The spin injection technique thus makes selective data write feasible.

Unfortunately, an MRAM using the spin injection technique poses the following problem in a read operation.

When reading out data, a read current is applied to a cell to read out the change in electric current or voltage caused by the resistance state of a memory element, in the same manner as in an ordinary MRAM. That is, the operation of applying an electric current to a memory element is performed in both data read and write. When reading out data, therefore, the problem (read disturbance) that data is written in a memory element by a read current may arise. When using a method that forms reference signals for data read from dummy cells in which data "0" and "1" are prewritten, the probability of read disturbance occurring in these dummy cells is highest.

In the prior art, a read current I is supplied in the same direction (from a free layer f to a pinned layer p) in both magneto-resistive elements of two reference cells RC in which data "0" and "1" are written. Therefore, the read current I is supplied in the same direction as a write current in one reference cell RC, and supplied in the direction opposite to the write current in the other reference cell RC. Accordingly, the probability of read disturbance occurring in the latter reference cell RC rises because the frequency at which the read current I flows through the reference cell RC is higher than that of an ordinary memory cell MC. This problem is serious from the viewpoint of quality control since an MRAM having no sequence of rewriting data in the reference cell RC is regarded as a defective product.

Non-patent reference 1: 2005 SYMPOSIUM ON VLSI TECHNOLOGY, p. 184

Patent reference 1: Jpn. Pat. Appln. KOKAI Publication No. 2004-220759 (e.g., FIG. 16)

BRIEF SUMMARY OF THE INVENTION

A magnetic random access memory according to the first aspect of the present invention comprises a memory element having a first fixed layer in which a magnetization direction is fixed, a first recording layer in which a magnetization direction changes in accordance with a direction of a write current, and a first nonmagnetic layer sandwiched between the first fixed layer and the first recording layer, a first reference element having a second fixed layer in which a magnetization direction is fixed, a second recording layer in which a magnetization direction changes in accordance with a direction of a write current, and a second nonmagnetic layer sandwiched between the second fixed layer and the second recording layer, antiparallel data being written in the first reference element, a second reference element making a pair with the first reference element, and having a third fixed layer in which a magnetization direction is fixed, a third recording layer in which a magnetization direction changes in accordance with a direction of a write current, and a third nonmagnetic layer sandwiched between the third fixed layer and the third recording layer, parallel data being written in the second reference element, and a current source which, when a read operation is performed, supplies a current from the second fixed layer to the second recording layer in the first reference element, and supplies the current from the third recording layer to the third fixed layer in the second reference element.

A data read method of a magnetic random access memory according to the second aspect of the present invention includes a memory element having a first fixed layer in which a magnetization direction is fixed, a first recording layer in which a magnetization direction changes in accordance with a direction of a write current, and a first nonmagnetic layer sandwiched between the first fixed layer and the first recording layer, a first reference element having a second fixed layer in which a magnetization direction is fixed, a second recording layer in which a magnetization direction changes in accordance with a direction of a write current, and a second nonmagnetic layer sandwiched between the second fixed layer and the second recording layer, antiparallel data being written in the first reference element, and a second reference element making a pair with the first reference element, and having a third fixed layer in which a magnetization direction is fixed, a third recording layer in which a magnetization direction changes in accordance with a direction of a write current, and a third nonmagnetic layer sandwiched between the third fixed layer and the third recording layer, parallel data being written in the second reference element, comprising when a read operation is performed, flowing a current from the second fixed layer to the second recording layer in the first reference element, and flowing the current from the third recording layer to the third fixed layer in the second reference element, generating a reference signal for the memory element.

A resistance random access memory according to the third aspect of the present invention comprises a memory element having a resistance which changes by a direction of an electric field between two terminals, a first reference element having a resistance which changes by a direction of an electric field between two terminals, and in which high-resistance data is written, a second reference element making a pair with the first reference element, having a resistance which changes by a direction of an electric field between two terminals, and in which low-resistance data is written, and a current source which, when a read operation is performed, supplies a current to a direction in which the high-resistance data is written in the first reference element, and supplies the current to a direction in which the low-resistance data is written in the second reference element.

BRIEF DESCRIPTION OF THE SEVERAL VIEWS OF THE DRAWING

FIG. 1 is a circuit diagram showing a magnetic random access memory according to the first embodiment of the present invention;

FIG. 2 is a schematic circuit diagram for explaining a read operation in the magnetic random access memory according to the first embodiment of the present invention;

FIG. 3 is a graph showing the resistance distributions of a magneto-resistive element according to the first embodiment of the present invention;

FIG. 7 is a circuit diagram showing a magnetic random access memory according to the second embodiment of the present invention;

DETAILED DESCRIPTION OF THE INVENTION

Figure 4:
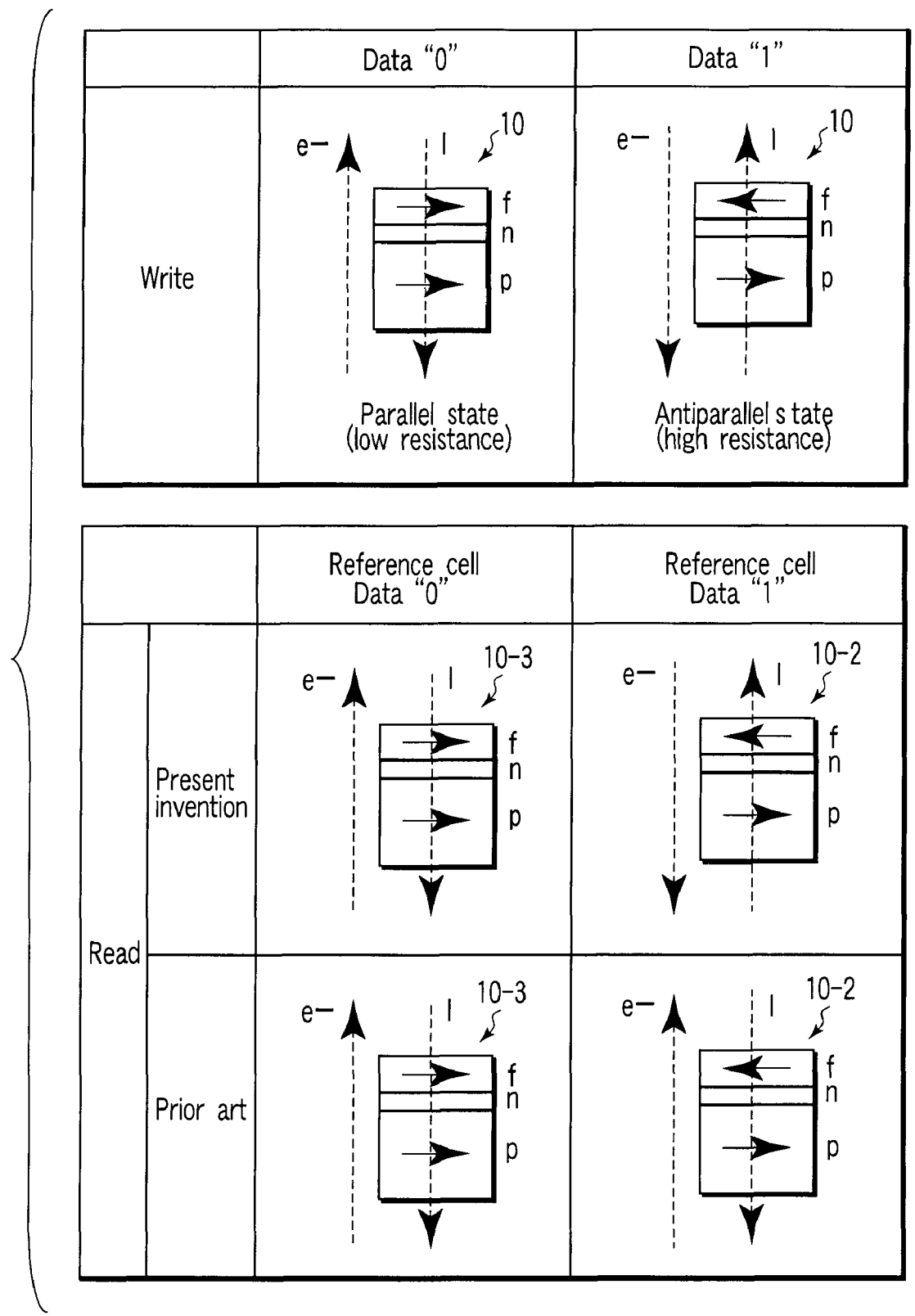
FIG. 4 is a view comparing the current directions of write and read according to the first embodiment of the present invention with the current direction of read in prior art.

A magnetic random access memory (MRAM) according to an embodiment of the present invention uses the spin injection technique when writing data, and, when reading out data, uses reference signals generated from reference elements in which data "0" (parallel data) and data "1" (antiparallel data) are prewritten. When reading out data, a read current is supplied, in the same direction as when writing data, to these reference elements in which the data "0" and "1" are written.

Note that data is parallel when the magnetization directions in a fixed layer and recording layer of a magneto-resistive element are parallel, and antiparallel when these magnetization directions are opposite. For convenience, the parallel data will be called data "0", and the antiparallel data will be called data "1".

Embodiments of the present invention will be explained below with reference to the accompanying drawing. In the following explanation, the same reference numerals denote the same parts throughout the drawing.

[1] First Embodiment

[1-1] Circuit Configuration

FIG. 1 is a circuit diagram of a magnetic random access memory according to the first embodiment of the present invention. The circuit configuration of the magnetic random access memory according to the first embodiment will be explained below. Note that FIG. 1 mainly shows a circuit configuration necessary for a read operation.

As shown in FIG. 1, in the magnetic random access memory of the first embodiment of the present invention, in order to allow a read current I to flow through reference cells RC1 and RC2 in the same direction as a write direction, a pinned layer p is grounded in a magneto-resistive element (reference element) 10-3, in which data "0" is written, of the reference cell RC2, and a free layer f is grounded in a magneto-resistive element (reference element) 10-2, in which data "1" is written, of the reference cell RC1. A practical circuit configuration is as follows.

Bit lines BL and word lines WL are arranged in the form of a matrix, and memory cells MC and reference cells RC are arranged at the intersections of the bit lines BL and word lines WL.

The memory cell MC has a magneto-resistive element (memory element) 10-1 and a selection transistor Tr1 connected in series with the magneto-resistive element 10-1. The magneto-resistive element 10-1 has one terminal (the pinned layer p) connected to one end of the current path of the selection transistor Tr1, and the other terminal (the free layer f) connected to a bit line BL1. The other end of the current path of the selection transistor Tr1 is connected to a bit line BL4, and the gate of the selection transistor Tr1 is connected to the word line WL. A row selector controller 11 controls the word line WL. The bit line BL1 is connected to one end of the current path of a selection transistor Tr4, and the other end of the current path of the selection transistor Tr4 is connected to a global data bus GDB1. The bit line BL4 is connected to one end of the current path of a selection transistor Tr7, and the other end of the current path of the selection transistor Tr7 is connected to a ground line GL. The gates of the selection transistors Tr4 and Tr7 are connected to and controlled by a column selector controller (CSL) 12.

The reference cell RC1 has the magneto-resistive element 10-2 and a selection transistor Tr2 connected in series with the magneto-resistive element 10-2. Data "1" is prewritten in the magneto-resistive element 10-2. That is, the magnetization directions in the pinned layer p and free layer f forming the magneto-resistive element 10-2 are, e.g., antiparallel. The magneto-resistive element 10-2 has one terminal (the pinned layer p) connected to one end of the current path of the selection transistor Tr2, and the other terminal (the free layer f) connected to a bit line BL2. The other end of the current path of the selection transistor Tr2 is connected to a bit line BL5, and the gate of the selection transistor Tr2 is connected to the word line WL. The bit line BL2 is connected to one end of the current path of a selection transistor Tr5, and the other end of the current path of the selection transistor Tr5 is connected to the ground line GL. The bit line BL5 is connected to one end of the current path of a selection transistor Tr8, and the other end of the current path of the selection transistor Tr8 is connected to a global data bus GDB2. The gates of the selection transistors Tr5 and Tr8 are connected to and controlled by the column selector controller (CSL) 12.

The reference cell RC2 has the magneto-resistive element 10-3 and a selection transistor Tr3 connected in series with the magneto-resistive element 10-3. Data "0" is prewritten in the magneto-resistive element 10-3. That is, the magnetization directions in the pinned layer p and free layer f forming the magneto-resistive element 10-3 are, e.g., parallel. The magneto-resistive element 10-3 has one terminal (the pinned layer p) connected to one end of the current path of the selection transistor Tr3, and the other terminal (the free layer f) connected to a bit line BL3. The other end of the current path of the selection transistor Tr3 is connected to a bit line BL6, and the gate of the selection transistor Tr3 is connected to the word line WL. The bit line BL3 is connected to one end of the current path of a selection transistor Tr6, and the other end of the current path of the selection transistor Tr6 is connected to the global data bus GDB2. The bit line BL6 is connected one end of the current path of a selection transistor Tr9, and the other end of the current path of the selection transistor Tr9 is connected to the ground line GL. The gates of the selection transistors Tr6 and Tr9 are connected to and controlled by the column selector controller (CSL) 12.

The global data bus GDB1 is connected to a power supply PS1 via a constant current source circuit (current conveyor) CC1. The global data bus GDB2 is connected to a power supply PS2 via a constant current source circuit (current conveyor) CC2. A read signal/Read controls the input terminals of the constant current source circuits CC1 and CC2.

The ground line GL is connected to a ground terminal G via a selection transistor Tr10. A read signal Read controls the gate of the selection transistor Tr10. The selection transistor Tr10 is enabled only when reading out data.

The global data buses GDB1 and GDB2 are connected to the input terminals of a sense amplifier S/A. The sense amplifier S/A outputs an output signal Dout as the result of read.

In the magnetic random access memory as described above, the magneto-resistive elements 10-2 of the reference cells RC1 are arranged in a line in the column direction in accordance with the row addresses of the memory cells MC, and the magneto-resistive elements 10-3 of the reference cells RC2 are arranged in a line in the column direction in accordance with the row addresses of the memory cells MC.

Note that it is also possible to arrange 2 to N lines of the magneto-resistive elements 10-2 of the reference cells RC1 in the column direction in accordance with the row addresses of the memory cells MC, and 2 to N lines of the magneto-resistive elements 10-3 of the reference cells RC2 in the column direction in accordance with the row addresses of the memory cells MC. This makes it possible to suppress signal variations of the reference cells, and improve the quality of reference signals.

[1-2] Write Operation

The magnetic random access memory according to the first embodiment of the present invention performs a write operation by using the spin injection technique.

The principle of the spin injection technique is as follows. A representative element for achieving spin injection magnetization reversal is a CPP (Current Perpendicular Plane)-GMR element. This element comprises two ferromagnetic films (e.g., CoFe) F1 and F2, and a nonmagnetic film (e.g., Cu) separating the ferromagnetic films F1 and F2. When an electric current is supplied perpendicularly to the film surface of this element, spin-polarized conduction electrons flow into the ferromagnetic film F2 from the ferromagnetic film F1 through the nonmagnetic film, and cause exchange interaction with electrons in the ferromagnetic film F2, thereby transferring the momentum of each spin. As a consequence, a torque is generated between these electrons. When the generated torque is sufficiently high, the magnetic moment in the ferromagnetic film F2 reverses. This is spin injection magnetization reversal.

Write currents necessary for switching are represented as follows (The Journal of The Magnetics Society of Japan, Vol. 28, No. 9, 2004).

$$Ic^{P \to AP} = -e(VMs/\mu_B)\alpha\gamma[Hext+(Hani+Ms)/2]/g(0)$$

$$Ic^{AP \to P} = -e(VMs/\mu_B)\alpha\gamma[Hext-(Hani+Ms)/2]/g(\Pi)$$

where $Ic^{P \to AP}$ is a critical current when the state changes from parallel to antiparallel, $Ic^{AP \to P}$ is a critical current when the state changes from antiparallel to parallel, V is the volume of the ferromagnetic film F2, Ms is the saturation magnetization of the ferromagnetic film F2, $\mu_B$ is the Bohr magneton, $\alpha$ is the Gilbert damping coefficient, $\gamma$ is the magnetic gyro coefficient ($\gamma$<0) of the ferromagnetic film F2, Hext is an externally applied magnetic field, Hani is the uniaxial anisotropic magnetic field of the ferromagnetic film F2, Ms is a demagnetizing field in the film thickness direction, and $g(\theta)$ is the efficiency.

This embodiment performs a write operation as follows by using the spin injection technique as described above.

As shown in FIG. 4, a magneto-resistive element 10 has a pinned layer p in which the magnetization direction remains unchanged, a free layer f which changes the magnetization direction by injection of spin-polarized electrons, and a nonmagnetic layer n sandwiched between the pinned layer p and free layer f. In the magneto-resistive element 10 like this, the magnetization directions in the pinned layer p and free layer f become parallel (the same direction) when electrons e flow from the pinned layer p to the free layer f, and become antiparallel (opposite directions) when the electrons e flow from the free layer f to the pinned layer p. In other words, the parallel state is obtained when an electric current I flows from the free layer f to the pinned layer p, and the antiparallel state is obtained when the electric current I flows from the pinned layer p to the free layer f.

When the magnetization directions in the pinned layer p and free layer f are parallel, the tunnel resistance of the nonmagnetic layer n is lowest. When the magnetization directions in the pinned layer p and free layer f are antiparallel, the tunnel resistance of the nonmagnetic layer n is highest.

Note that some circuits necessary for the write operation are omitted from FIG. 1. However, write circuits (e.g., a current source/sinker) are connected to the two terminals of each magneto-resistive element 10-1, so that a bidirectional write current flows through the magneto-resistive element 10-1 of a selected cell when writing data.

[1-3] Read Operation

The magnetic random access memory according to the first embodiment of the present invention generates reference signals necessary for read by using the reference elements in which data "1" and "0" are prewritten, and discriminates data by comparing the synthetic resistance of the reference elements containing "1" and "0" with the resistance of the magneto-resistive element of a selected cell.

FIG. 2 is a schematic circuit diagram for explaining a read operation in the magnetic random access memory according to the first embodiment of the present invention. FIG. 3 shows the resistance distributions of the magneto-resistive element according to the first embodiment of the present invention. FIG. 4 is a view comparing the current directions of read and write according to the first embodiment of the present invention with the current direction of read in prior art.

In the read operation as shown in FIG. 1, only the word line WL in the same row as the memory cell MC to be read changes to H level "H", and the transistors Tr1, Tr2, and Tr3 connected to the word line WL are turned on. The power supplies PS1 and PS2 and constant current source circuits CC1 and CC2 supply the read current I to the memory cell MC and reference cells RC1 and RC2.

As shown in FIG. 2, the global data bus GDB2 short-circuits the magneto-resistive elements 10-2 and 10-3. Accordingly, an electric current or voltage (reference signal S2) corresponding to a synthetic resistance (Ra+Rp)/2 of the magneto-resistive elements 10-2 and 10-3 appears on the global data bus GDB2. On the other hand, an electric current or voltage (signal S1) corresponding to the resistance state of the magneto-resistive element 10-1 in the memory cell MC as an object of read appears on the global data bus GDB1. The sense amplifier S/A compares the two signals S1 and S2, and determines the resistance state of the magneto-resistive element 10-1 in the memory cell MC as an object of read.

As shown in FIG. 3, the magneto-resistive element normally has a predetermined frequency distribution for each of resistances Rp and Ra of data "0" and "1". The frequency distribution of the synthetic resistance (Ra+Rp)/2 of the magneto-resistive elements 10-2 and 10-3 of the reference cells RC1 and RC2 lies midway between the frequency distributions of the resistances Rp and Ra. Therefore, the voltage or electric current (reference value) resulting from the synthetic resistance (Ra+Rp)/2 is compared with the voltage or electric current (output value) resulting from the resistance of the magneto-resistive element 10-1 to be read. If the output value of the magneto-resistive element 10-1 is smaller than the reference value, it is determined that the data of the magneto-resistive element 10-1 is low-resistance data "0". If the output value of the magneto-resistive element 10-1 is larger than the reference value, it is determined that the data of the magneto-resistive element 10-1 is high-resistance data "1".

In the read operation as described above, as shown in FIG. 4, the read current I flows from the free layer f to the pinned layer p in the magneto-resistive element 10-3 in which data "0" is written. That is, the electrons e flow from the pinned layer p to the free layer f. This direction is the same as the direction of the write current I when writing data "0" in the magneto-resistive element by using the spin injection technique.

On the other hand, as shown in FIG. 4, the read current I flows from the pinned layer p to the free layer f in the magneto-resistive element 10-2 in which data "1" is written. That is, the electrons e flow from the free layer f to the pinned layer p. This direction is the same as the direction of the write current I when writing data "1" in the magneto-resistive element by using the spin injection technique.

[1-4] Layout and Sectional Structure of Reference Cells

Figure 5A:
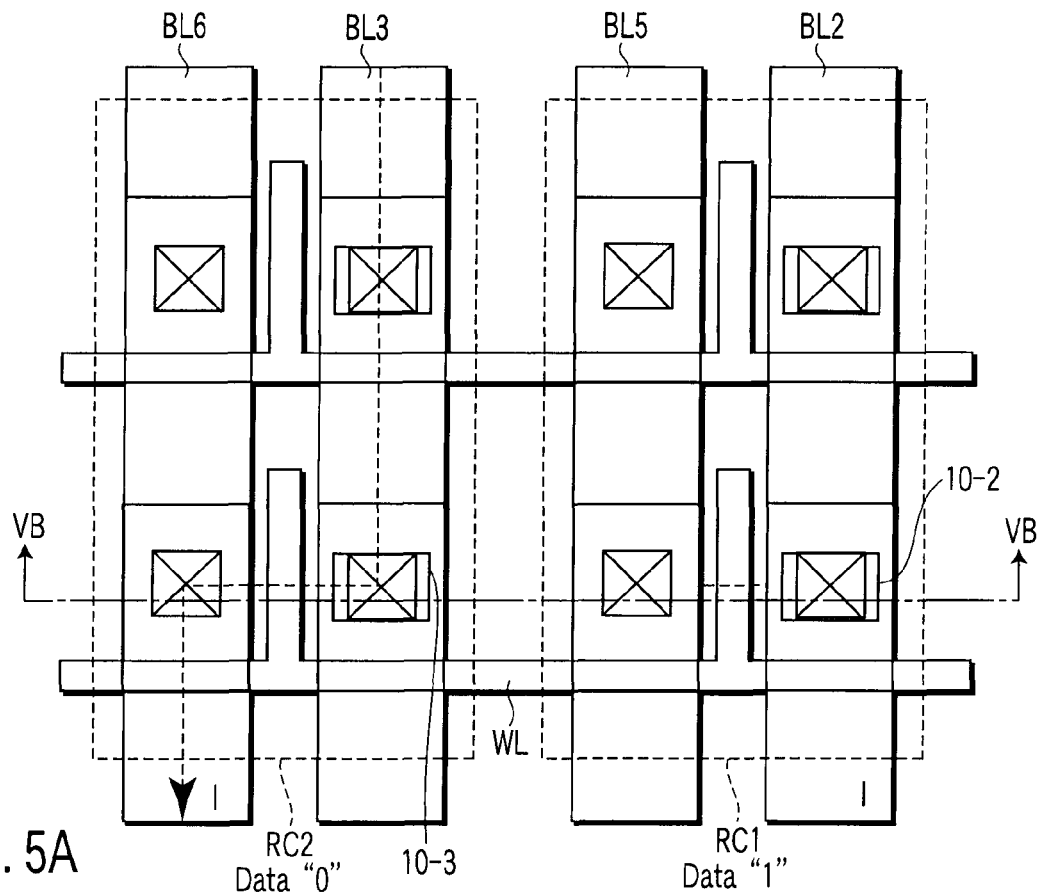
FIG. 5A is a view showing the layout of reference cells in the magnetic random access memory according to the first embodiment of the present invention.
Figure 5B:
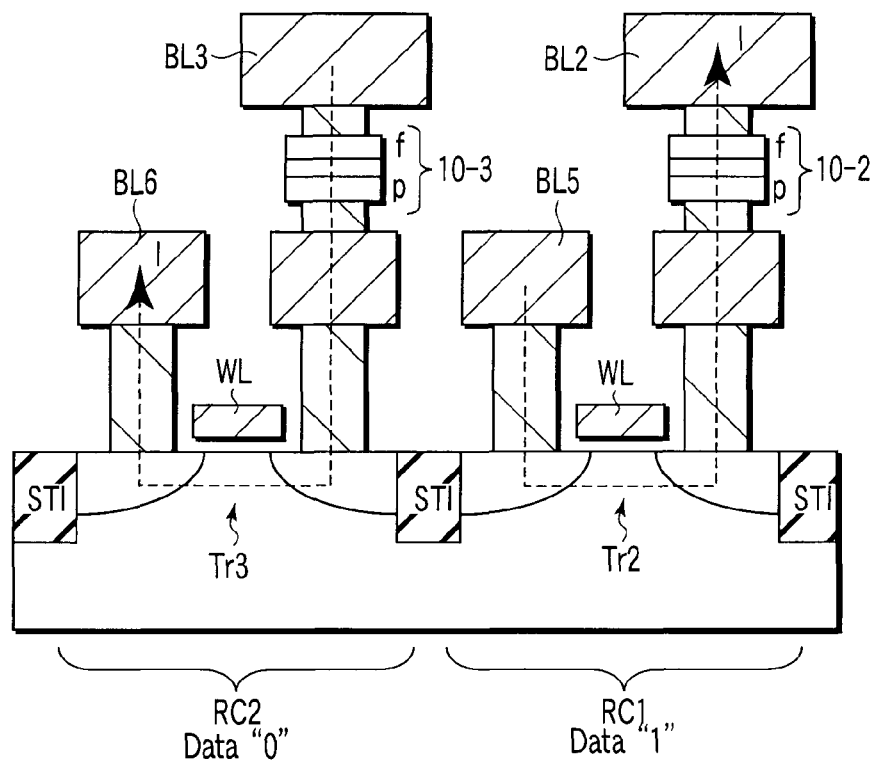
FIG. 5B is a sectional view taken along a line VB-VB in FIG. 5A.
Figure 6A:
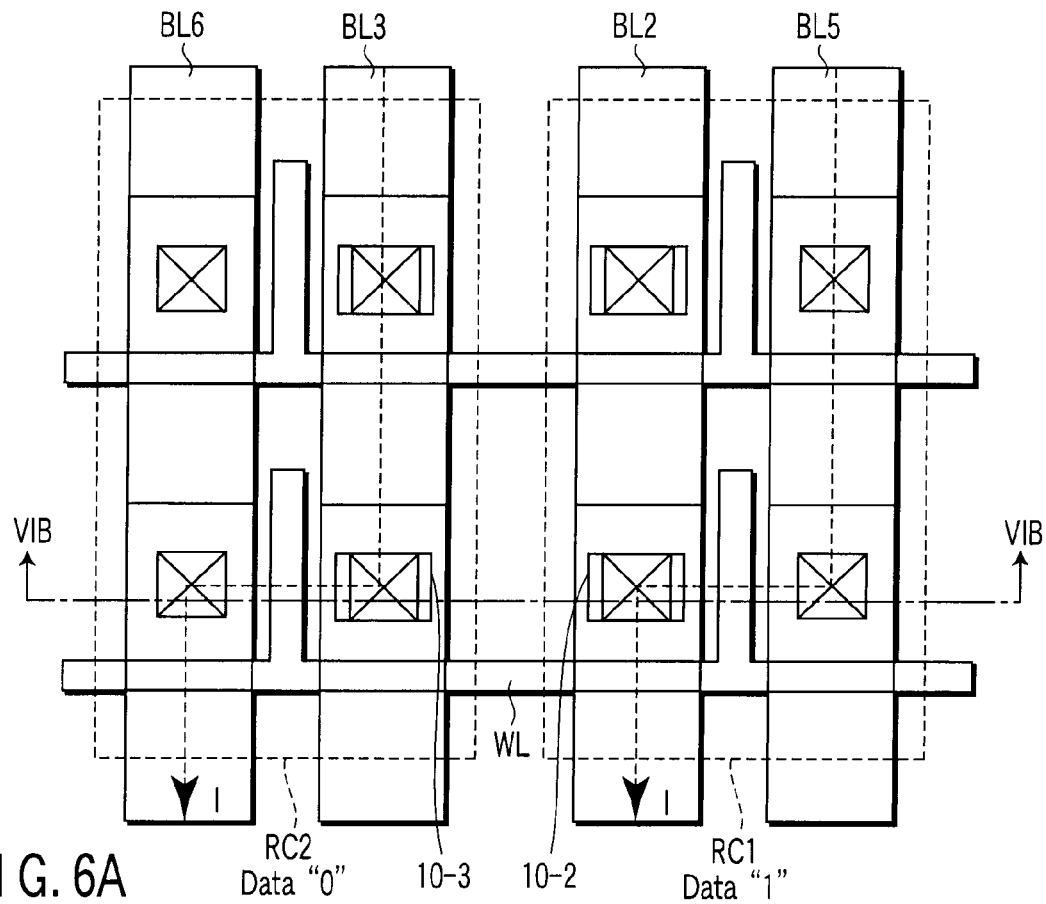
FIG. 6A is a view showing another layout of the reference cells of the magnetic random access memory according to the first embodiment of the present invention.
Figure 6B:
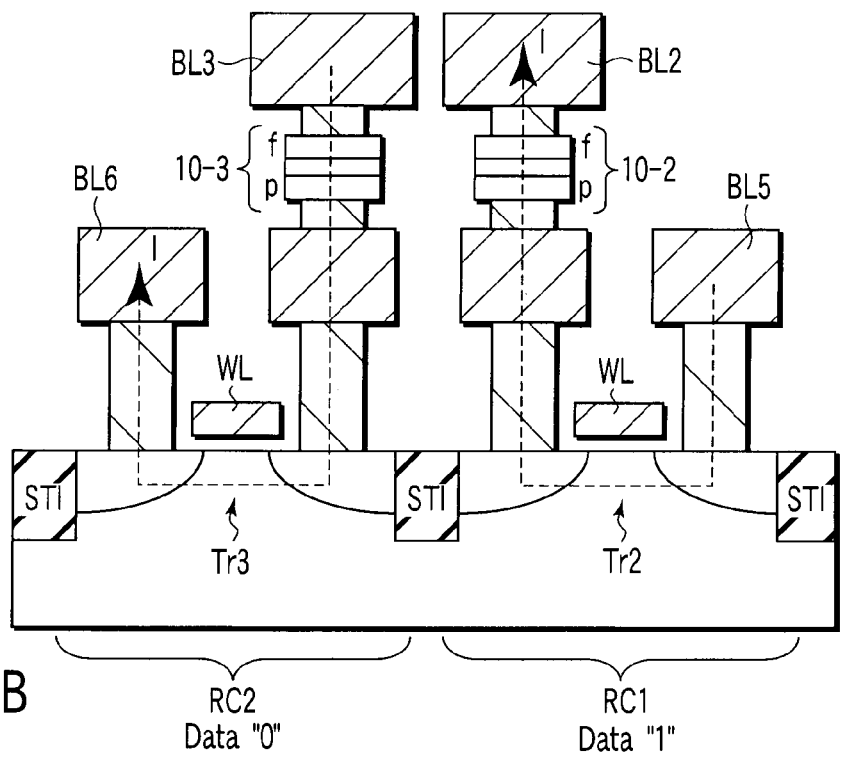
FIG. 6B is a sectional view taken along a line VIB-VIB in FIG. 6A.

FIG. 5A shows the layout of the reference cells of the magnetic random access memory according to the first embodiment of the present invention. FIG. 5B is a sectional view taken along a line VB-VB in FIG. 5A. FIG. 6A shows another layout of the reference cells of the magnetic random access memory according to the first embodiment of the present invention. FIG. 6B is a sectional view taken along a line VIB-VIB in FIG. 6A.

As shown in FIGS. 5A and 5B, in the reference cell RC1, the read current I flowing from the bit line BL5 to the transistor Tr2 flows from the pinned layer p to the free layer f in the magneto-resistive element 10-2, and flows to the ground line GL through the bit line BL2. On the other hand, in the reference cell RC2, the read current I flows in the direction opposite to that in the reference cell RC1. That is, in the reference cell RC2, the read current I flowing from the bit line BL3 flows from the free layer f to the pinned layer p in the magneto-resistive element 10-3, and flows from the transistor Tr3 to the ground line GL through the bit line BL6.

As shown in FIG. 5B, the bit lines BL5 and BL6 are made of first metal interconnections M1, and the bit lines BL2 and BL3 are made of second metal interconnections M2. That is, the bit lines BL5 and BL6 and the bit lines BL2 and BL3 are made of different metal layers, and hence arranged on different interconnection levels.

Note that as shown in FIGS. 6A and 6B, it is also possible to arrange the bit lines BL2 and BL3 between the bit lines BL5 and BL6, thereby gathering the magneto-resistive elements 10-2 and 10-3 in the center.

[1-5] Magneto-Resistive Element

The magneto-resistive element comprises the pinned layer (fixed layer) p in which the magnetization direction is fixed, the free layer (recording layer) f in which the magnetization direction changes in accordance with the direction of the write current I, and the nonmagnetic layer n sandwiched between the pinned layer p and free layer f.

The pinned layer 2 and free layer f are made of a ferromagnetic material. For example, it is favorable to use a film containing one of Fe, Co, and Ni, or an alloy film (e.g., CoFe or NiFe) containing at least one of Fe, Co, and Ni.

When the nonmagnetic layer n is made of a conductive material (e.g., a metal such as Cu or Pt), the magneto-resistive element has the GMR (Giant Magneto-Resistive) effect. When the nonmagnetic layer n is made of an insulating material (e.g., MgO or $Al_2O_3$), the magneto-resistive element has the TMR (Tunneling Magneto-Resistive) effect.

Each of the pinned layer p and free layer f is not limited to a single layer as shown in FIG. 2. For example, each of the pinned layer p and free layer f may also be a layered film including a plurality of ferromagnetic layers. At least one of the pinned layer p and free layer f may also have an antiferromagnetic coupling structure which includes three layers, i.e., a first ferromagnetic layer/nonmagnetic layer/second ferromagnetic layer, and in which the first and second ferromagnetic layers magnetically couple with each other (by interlayer exchange coupling) such that the magnetization directions in these layers are antiparallel, or a ferromagnetic coupling structure in which the first and second ferromagnetic layers magnetically couple with each other (by interlayer exchange coupling) such that the magnetization directions in these layers are parallel.

The magneto-resistive element is not limited to a single-junction structure including one nonmagnetic layer as shown in FIG. 2, and may also have a double-junction structure including two nonmagnetic layers. A magneto-resistive element having this double-junction structure comprises a first pinned layer, a second pinned layer, a free layer formed between the first and second pinned layers, a first nonmagnetic layer formed between the first pinned layer and free layer, and a second nonmagnetic layer formed between the second pinned layer and free layer.

The planar shape of the magneto-resistive element can be variously changed. Examples are a rectangle, ellipse, circle, hexagon, rhomb, parallelogram, cross, and bean (recessed shape).

The magneto-resistive element can be a parallel magnetization type element in which the magnetization stabilizing directions in the pinned layer p and free layer f are parallel to the film surface, or a perpendicular magnetization type element in which the magnetization stabilizing directions in the pinned layer p and free layer f are perpendicular to the film surface.

[1-6] Effects

In the conventional magnetic random access memory, in both the magneto-resistive elements of reference cells in which data "1" and "0" are written, the pinned layer p is connected to the ground G, and the free layer f is connected to the sense amplifier S/A.

In the conventional read operation, therefore, as shown in FIG. 4, the electric current I (electrons e) is applied in the same direction to the magneto-resistive elements 10-2 and 10-3. Consequently, in the magneto-resistive element 10-2 in which data "1" is written, the electric current I flows in the direction opposite to that when writing data "1". Accordingly, the magneto-resistive element 10-2 may pose the problem of read disturbance by which data is written by the read current I.

On the other hand, in the magnetic random access memory according to the first embodiment, as shown in FIG. 1, the free layer f is connected to the ground line GL and the pinned layer p is connected to the global data bus GDB in the magneto-resistive element 10-2 in which data "1" is written, and the free layer f is connected to the global data bus GDB and the pinned layer p is connected to the ground line GL in the magneto-resistive element 10-3 in which data "0" is written, so that the read current I flows in the same direction as the write direction in the reference cells RC1 and RC2.

In the read operation according to the first embodiment, therefore, as shown in FIG. 4, the read current I flows from the pinned layer p to the free layer f in the magneto-resistive element 10-2 in which data "1" is written. On the other hand, the read current I flows from the free layer f to the pinned layer p in the magneto-resistive element 10-3 in which data "0" is written. Accordingly, the direction of the electrons e flowing through the reference cells RC1 and RC2 is the same as the direction in which spin-polarized electrons are applied in order to, e.g., rewrite data. That is, the read current I is always applied in the direction of overwrite in this arrangement. This makes it possible to suppress programming of data when they are read out from the reference cells RC1 and RC2. Since this decreases the possibility of read disturbance, the reliability of data of the device can improve.

[2] Second Embodiment

In the first embodiment, the read current I flows through the selection transistor Tr2 before the magneto-resistive element 10-2 in one reference cell (in this case, the reference cell RC1). In cells except for the reference cell RC1, the read current I flows through the magneto-resistive element before the selection transistor. Since this makes the back gate effect of the selection transistor Tr2 of the reference cell RC1 different from those of the selection transistors of other cells, the current drivability changes. This is unfavorable from the viewpoint of the use of reference signals.

In a magnetic random access memory using the spin injection technique, the resistance value of a magneto-resistive element is similar to that of a cell selection transistor. Therefore, the change in ON resistance of the cell selection transistor has influence on the read signal amount. On the other hand, the back gate effect herein mentioned is obtained because the voltage of the source terminal of an nMOS transistor changes in accordance with whether the source terminal is directly connected to a ground line or connected to it via a magneto-resistive element. Since this changes the threshold value of the transistor, the ON resistance of the latter becomes higher than that of the former.

In the second embodiment, therefore, interconnections are changed to connect a read current source, magneto-resistive element, cell selection transistor, and ground line in this order in order to avoid the above problem. This allows a read current to flow from the magneto-resistive element to the selection transistor in all reference cells. Note that an explanation of the same points as in the first embodiment will be omitted in the second embodiment.

[2-1] Circuit Configuration

FIG. 7 is a circuit diagram of a magnetic random access memory according to the second embodiment of the present invention. The circuit configuration of the magnetic random access memory according to the second embodiment will be explained below. Note that FIG. 7 mainly shows a circuit configuration necessary for a read operation.

As shown in FIG. 7, the second embodiment differs from the first embodiment in that a read current I flows from a magneto-resistive element 10-2 to a selection transistor Tr2 in a reference cell RC1, in the same manner as in a reference cell RC2.

More specifically, in the reference cell RC1, the magneto-resistive element 10-2 has one terminal (a free layer f) connected to one end of the current path of the selection transistor Tr2, and the other terminal (a pinned layer p) connected to a bit line BL2. The other end of the current path of the selection transistor Tr2 is connected to a bit line BL5, and the gate of the selection transistor Tr2 is connected to a word line WL. The bit line BL2 is connected to one end of the current path of a selection transistor Tr5, and the other end of the current path of the selection transistor Tr5 is connected to a global data bus GDB2. The bit line BL5 is connected one end of the current path of a selection transistor Tr8, and the other end of the current path of the selection transistor Tr8 is connected to a ground line GL. The gates of the selection transistors Tr5 and Tr8 are connected to and controlled by a column selector controller (CSL) 12.

Note that the difference between the reference cells RC1 and RC2 is that the free layer f of the magneto-resistive element 10-2 is connected to the selection transistor Tr2 in the reference cell RC1, but the pinned layer p of a magneto-resistive element 10-3 is connected to a selection transistor Tr3 in the reference cell RC2.

[2-2] Read Operation

In the read operation according to the second embodiment, as in the first embodiment described above, only the word line WL in the same row as a memory cell MC to be read changes to H level "H", and a transistor Tr1 and the transistors Tr2 and Tr3 connected to the word line WL are turned on. Power supplies PS1 and PS2 and constant current source circuits CC1 and CC2 apply the read current I to the memory cell MC and reference cells RC1 and RC2 via a global data bus GDB1 and the global data bus GBD2.

In the reference cell RC2 in which data "0" is written, the read current I flows from the magneto-resistive element 10-3 to the selection transistor Tr3. In the magneto-resistive element 10-3, the read current I flows from the free layer f to the pinned layer p. That is, electrons e flow from the pinned layer p to the free layer f. This direction is the same as the direction of a write current when writing data "0" in the magneto-resistive element 10-3 by using the spin injection technique.

In the reference cell RC1 in which data "1" is written, the read current I flows from the magneto-resistive element 10-2 to the selection transistor Tr2, as in the reference cell RC2. In the magneto-resistive element 10-2, the read current I flows from the pinned layer p to the free layer f. That is, the electrons e flow from the free layer f to the pinned layer 2. This direction is the same as the direction of a write current when writing data "1" in the magneto-resistive element 10-2 by using the spin injection technique.

In the read operation of the second embodiment, therefore, in both the reference cells RC1 and RC2, the read current I flows from the magneto-resistive element to the selection transistor, and flows in the same direction as the direction of a write current when writing data "0" or "1" by using the spin injection technique.

[2-3] Layout and Sectional Structure of Reference Cells

Figure 8A:
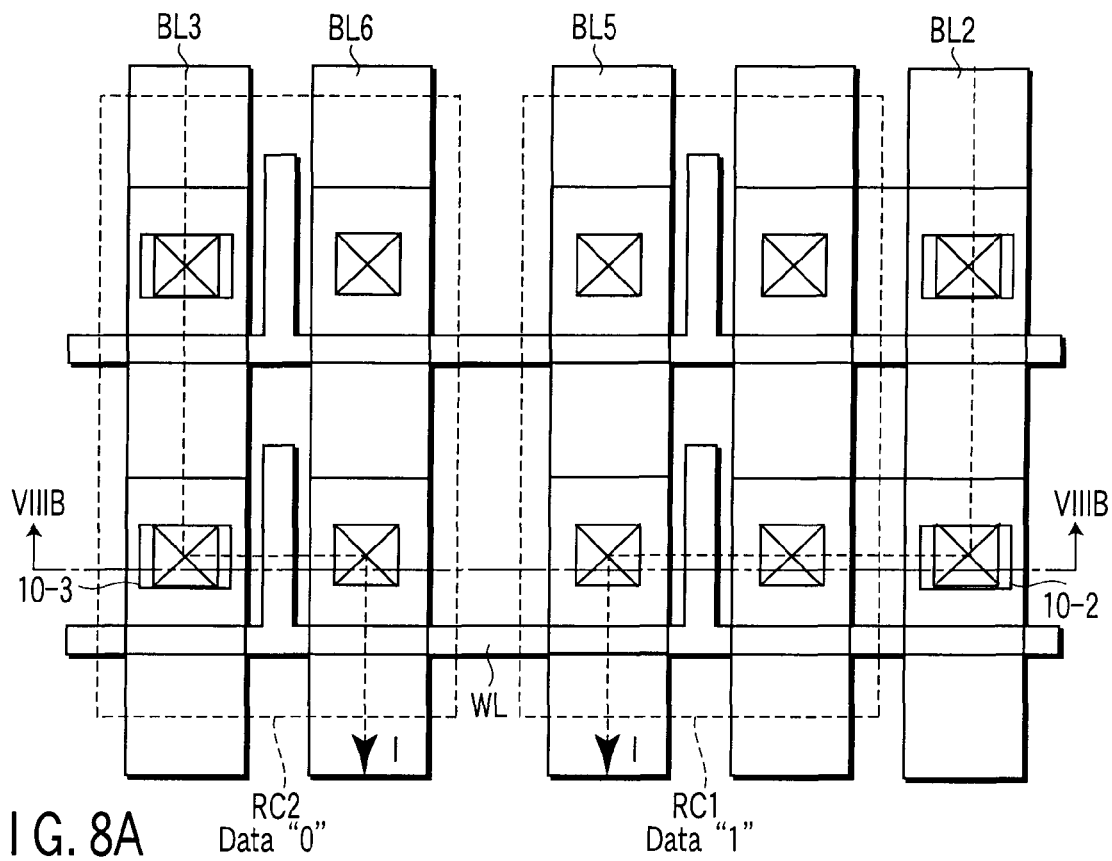
FIG. 8A is a view showing the layout of reference cells of the magnetic random access memory according to the second embodiment of the present invention.
Figure 8B:
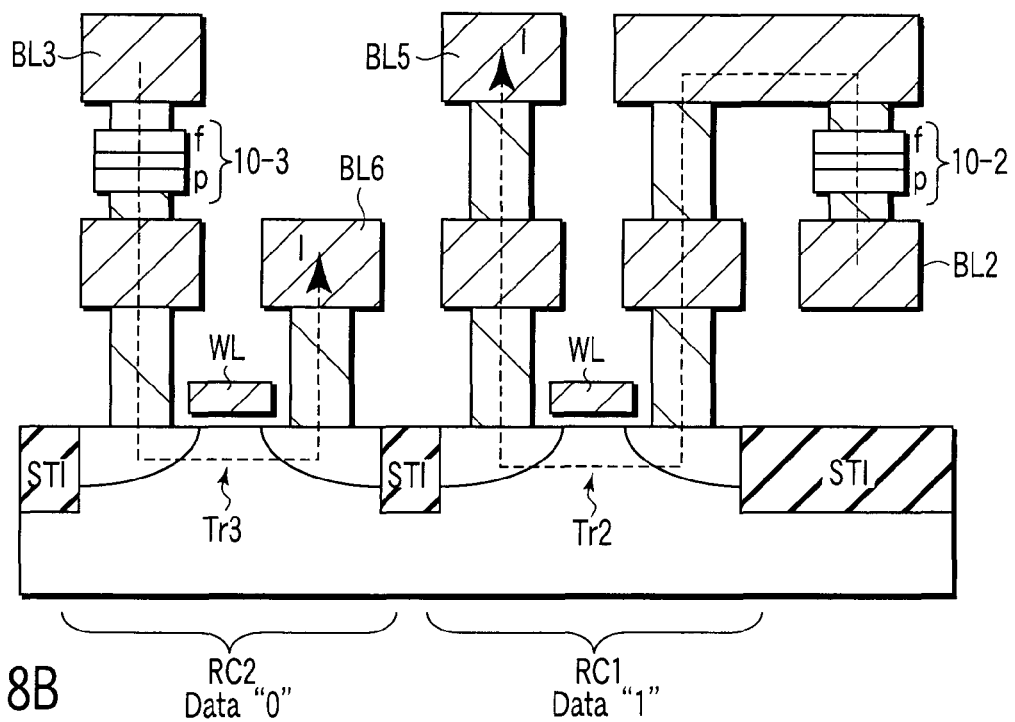
FIG. 8B is a sectional view taken along a line VIIIB-VIIIB in FIG. 8A.

FIG. 8A shows the layout of the reference cells of the magnetic random access memory according to the second embodiment of the present invention. FIG. 8B is a sectional view taken along a line VIIIB-VIIIB in FIG. 8A.

As shown in FIGS. 8A and 8B, in the reference cell RC1, the read current I flowing from the bit line BL2 flows from the pinned layer p to the free layer f in the magneto-resistive element 10-2, and flows from the transistor Tr2 to the ground line GL through the bit line BL5. On the other hand, in the reference cell RC2, the read current I flows in the direction opposite to that in the reference cell RC1. That is, in the reference cell RC2, the read current I flowing from a bit line BL3 flows from the free layer f to the pinned layer p in the magneto-resistive element 10-3, and flows from the transistor Tr3 to the ground line GL through a bit line BL6.

As shown in FIG. 8B, the bit lines BL2 and BL6 are made of first metal interconnections M1, and the bit lines BL3 and BL5 are made of second metal interconnections M2. That is, the bit lines BL2 and BL6 and the bit lines BL3 and BL5 are made of different metal layers, and hence arranged on different interconnection levels.

[2-4] Effects

The size of the reference cell in the lateral direction is larger in the second embodiment than in the first embodiment. However, it is possible to avoid programming of data in the reference cell by the read current, as in the first embodiment.

In addition, in the second embodiment, the read current I flows from the magneto-resistive element to the selection transistor in both the reference cells RC1 and RC2. This eliminates the difference between reference signals produced by the back gate effect of the selection transistor. This makes it possible to prevent deterioration of the read margin caused by the selection transistor, and generate ideal reference signals.

[3] Third Embodiment

In the third embodiment, the current path of a magneto-resistive element to be read and the current path of a reference signal are similarly set from the viewpoint of the parasitic resistance of a current path through which a readout signal flows. Note that an explanation of the same points as in the first embodiment will be omitted in the third embodiment.

[3-1] Circuit Configuration

Figure 9:
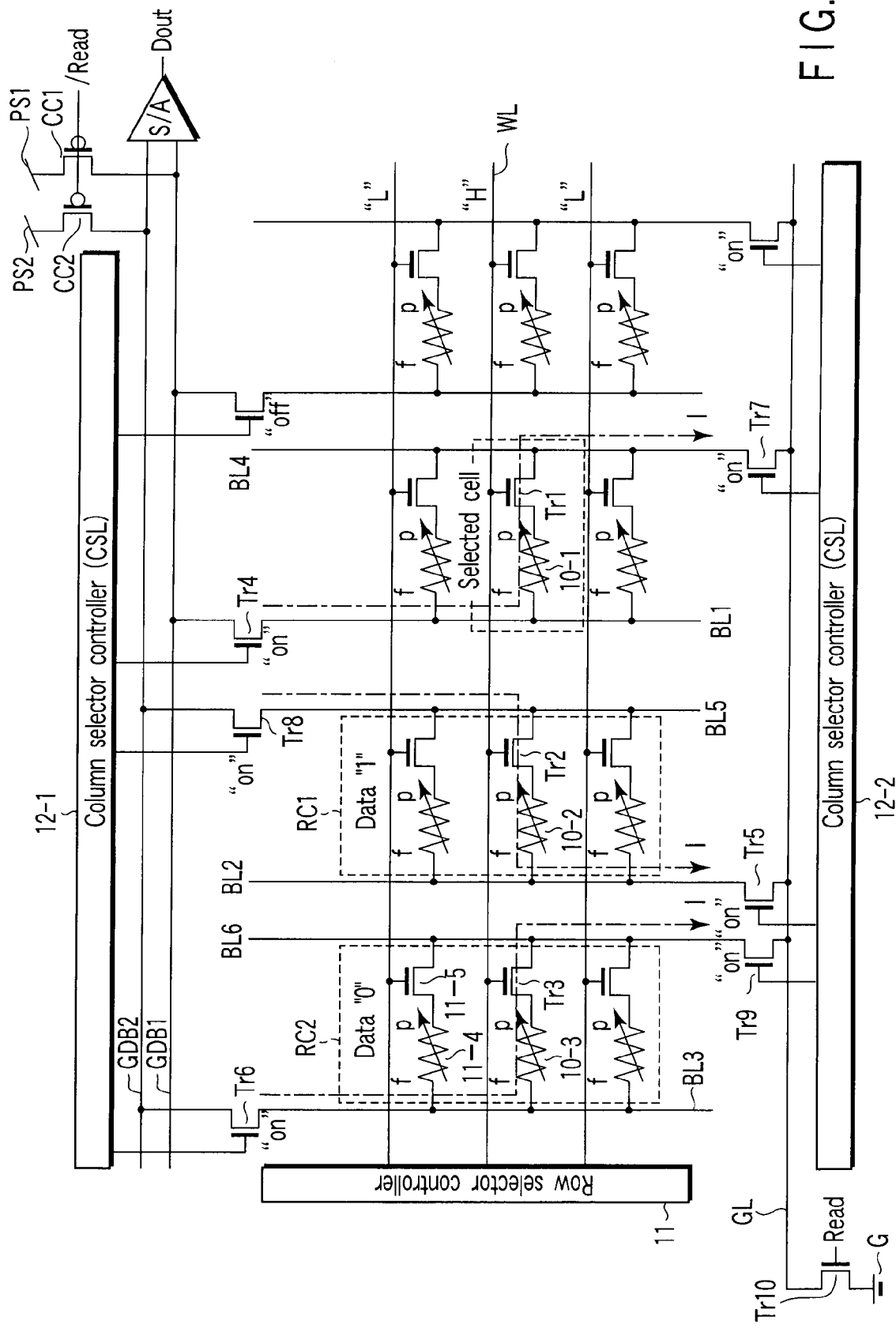
FIG. 9 is a circuit diagram showing a magnetic random access memory according to the third embodiment of the present invention.

FIG. 9 is a circuit diagram of a magnetic random access memory according to the third embodiment of the present invention. The circuit configuration of the magnetic random access memory according to the third embodiment will be explained below. Note that FIG. 9 mainly shows a circuit configuration necessary for a read operation. Note also that connections are changed in FIG. 9 on the basis of the circuit of the first embodiment, but it is of course also possible to change the connections on the basis of the circuit of the second embodiment.

As shown in FIG. 9, the third embodiment differs from the first embodiment in that a ground line GL is formed at the array end different from global data buses GDB1 and GDB2.

That is, in the third embodiment, column selector controllers (CSL) 12-1 and 12-2 are arranged at the two ends of the array in the column direction. Bit lines BL1, BL5, and BL3 are connected to the global data buses GDB1 and GDB2 via selection transistors Tr4, Tr8, and Tr6, respectively, and the column selector controller (CSL) 12-1 controls the gates of the selection transistors Tr4, Tr8, and Tr6. Bit lines BL4, BL2, and BL6 are connected to the ground line GL via selection transistors Tr7, Tr5, and Tr9, respectively, and the column selector controller (CSL) 12-2 controls the gates of the selection transistors Tr7, Tr5, and Tr9.

Note that one end of the bit line BL3 is connected to the global data bus GDB2 via the selection transistor Tr6.

[3-2] Effects

The third embodiment can avoid programming of data in a reference cell caused by a read current as in the first embodiment, and can also achieve the following effect.

In the first embodiment shown in FIG. 1, the read current flows out from the upper right corner of the array, and flows into the upper-right sinker after passing through the array. Since this makes the length of an interconnection through which the read current flows in a cell on the right side of the array different from that on the left side of the array, the interconnection resistances on the right and left sides are different.

By contrast, in the third embodiment shown in FIG. 9, the read current flows out from the upper right corner of the array, and flows into the lower-left sinker of the array after passing through the array. Therefore, the length of an interconnection through which the read current flows remains unchanged regardless of the address in the array. That is, the electric current flowing through a magneto-resistive element 10-1 of a memory cell MC and the electric current flowing through magneto-resistive elements 10-2 and 10-3 of reference cells RC1 and RC2 flow through paths having the same length. Accordingly, a sufficient signal margin can be secured because the individual signals are given the same parasitic resistance component.

[4] Fourth Embodiment

The fourth embodiment is an example in which each of the above embodiments is applied to an ReRAM (Resistance Random Access Memory). The memory element of ReRAM has the resistance which changes by the direction of the electric field between the two terminals.

Figure 10:
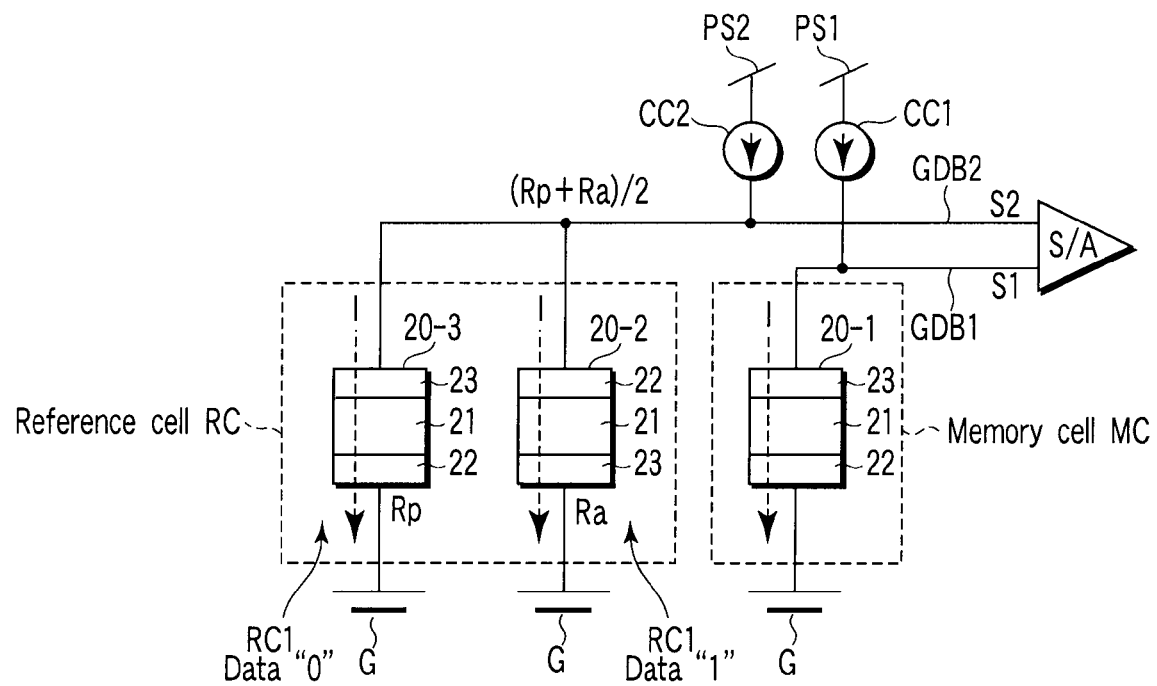
FIG. 10 is a schematic circuit diagram for explaining a read operation in an ReRAM according to the fourth embodiment of the present invention.

FIG. 10 is a schematic circuit diagram of the ReRAM according to the fourth embodiment of the present invention. The circuit configuration, write operation, and read operation of this ReRAM will be explained below with reference to FIG. 10.

[4-1] Circuit Configuration

The ReRAM uses transition metal oxide elements 20-1, 20-2, and 20-3 as memory elements of a memory cell MC and reference cells RC. The transition metal oxide elements 20-1, 20-2, and 20-3 each have a transition metal oxide layer 21, lower electrode 22, and upper electrode 23. The transition metal oxide layer 21 is formed between the lower electrode 22 and upper electrode 23, and functions as a storage portion.

The transition metal oxide layer 21 is made of, e.g., binary transition metal oxide or perovskite metal oxide. Examples of the binary transition metal oxide are NiO, $TiO_2$, $HfO_2$, and $ZrO_2$. Examples of the perovskite metal oxide are $Pr_{0.7}Ca_{0.3}MnO_3$ (PCMO) and Nb-added $SrTiO_3$ (Nb:STO).

In the ReRAM, similar to the MRAM, in order to allow a read current I to flow through reference cells RC1 and RC2 in the same direction as a write direction, the lower electrode 22 is grounded in the transition metal oxide element 20-3, in which data "0" (low-resistance data) is written, of the reference cell RC2, and the upper electrode 23 is grounded in the transition metal oxide element 20-2, in which data "1" (high-resistance data) is written, of the reference cell RC1.

Note that the circuit configuration of the ReRAM is the same as the MRAM described above except that the magneto-resistive elements 10-1, 10-2, and 10-3 are respectively replaced with the transition metal oxide elements 20-1, 20-2, and 20-3. Therefore, the circuit configuration of this embodiment is obtained by replacing the magneto-resistive elements 10-1, 10-2, and 10-3 in each drawing of each embodiment with the transition metal oxide elements 20-1, 20-2, and 20-3, respectively.

[4-2] Write Operation

When the polarity of the application voltage is reversed, the transition metal oxide element 20-1 largely changes its resistance value and produces a high-resistance state Ra and low-resistance state Rp.

More specifically, to change the transition metal oxide element 20-1 to the low-resistance state Rp (e.g., data 0), the polarity of the application voltage is made negative at the lower electrode 22 and positive at the upper electrode 23. Consequently, a write current flows from the upper electrode 23 to the lower electrode 22 via the transition metal oxide layer 21. On the other hand, to change the transition metal oxide element 20-1 to the high-resistance state Ra (e.g., data 1), the polarity of the application voltage is made positive at the lower electrode 22 and negative at the upper electrode 23. As a result, the write current flows from the lower electrode 22 to the upper electrode 23 via the transition metal oxide layer 21.

[4-3] Read Operation

Similar to the MRAM, the ReRAM generates reference signals necessary for read by using the transition metal oxide elements 20-2 and 20-3 in which data "1" and "0" are respectively prewritten, and compares a synthetic resistance (Ra+Rp)/2 of the transition metal oxide elements 20-2 and 20-3 respectively containing data "1" and "0" with the resistance of the transition metal oxide element 20-1 of a selected cell, thereby discriminating data.

In the read operation like this, in the transition metal oxide element 20-3 in which data "0" is written, the read current I flows from the upper electrode 23 to the lower electrode 22. This direction is the same as the direction of the write current I when writing data "0" in the transition metal oxide element 20-1.

On the other hand, in the transition metal oxide element 20-2 in which data "1" is written, the read current I flows from the lower electrode 22 to the upper electrode 23. This direction is the same as the direction of the write current I when writing data "1" in the transition metal oxide element 20-1.

[4-4] Effects

In the fourth embodiment, the read current I is always supplied in the direction of overwrite as in each embodiment described above. When reading out data from the reference cells RC1 and RC2, therefore, programming of the data can be suppressed. Since this decreases the possibility of read disturbance, the reliability of data of the device can improve.

Note that each embodiment described above is also applicable to a resistive memory using the CMR (Colossal Magneto-Resistance) effect that largely changes the resistance value upon application of a magnetic field.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:

a memory element having a first fixed layer in which a magnetization direction is fixed, a first recording layer in which a magnetization direction changes in accordance with a direction of a write current, and a first nonmagnetic layer sandwiched between the first fixed layer and the first recording layer;

a first reference element having a second fixed layer in which a magnetization direction is fixed, a second recording layer in which a magnetization direction changes in accordance with a direction of a write current, and a second nonmagnetic layer sandwiched between the second fixed layer and the second recording layer, antiparallel data being written in the first reference element;

a second reference element making a pair with the first reference element, and having a third fixed layer in which a magnetization direction is fixed, a third recording layer in which a magnetization direction changes in accordance with a direction of a write current, and a third nonmagnetic layer sandwiched between the third fixed layer and the third recording layer, parallel data being written in the second reference element; and a current source which, when a read operation is performed, supplies a current from the second fixed layer to the second recording layer in the first reference element, and supplies the current from the third recording layer to the third fixed layer in the second reference element.

2. The memory according to claim 1, which further comprises:

a first transistor having a first current path whose one end is connected to the first fixed layer;

a second transistor having a second current path whose one end is connected to the second fixed layer;

a third transistor having a third current path whose one end is connected to the third fixed layer;

a word line connected to gates of the first transistor, the second transistor, and the third transistor;

a ground terminal connected to the other end of the first current path, the second recording layer, and the other end of the third current path; and a sense amplifier having a first input connected to the first recording layer, and a second input connected to the other end of the second current path and the third recording layer, and in which when the read operation is performed, the current flows from the second transistor to the first reference element, and flows from the second reference element to the third transistor.

3. The memory according to claim 2, which further comprises:
- a first bit line, a second bit line, and a third bit line respectively connected to the first recording layer, the second recording layer, and the third recording layer, and running in a column direction;
- a fourth bit line, a fifth bit line, and a sixth bit line respectively connected to the first fixed layer, the second fixed layer, and the third fixed layer, and running in the column direction;
- a fourth transistor, a fifth transistor, a sixth transistor, a seventh transistor, an eighth transistor, and a ninth transistor each having a current path whose one end is connected to a corresponding one of the first bit line, the second bit line, the third bit line, the fourth bit line, the fifth bit line, and the sixth bit line;
- a ground line connected to the other end of each of the current paths of the fifth transistor, the seventh transistor, and the ninth transistor, and having an end portion connected to the ground terminal;
- a first global data bus connected to the other end of the current path of the fourth transistor, and having an end portion connected to the first input;
- a second global data bus connected to the other end of each of the current paths of the sixth transistor and the eighth transistor, and having an end portion connected to the second input; and
- a column selector controller connected to gates of the fourth transistor, the fifth transistor, the sixth transistor, the seventh transistor, the eighth transistor, and the ninth transistor, and
- in which the ground line, the first global data bus, and the second global data bus are arranged on the same array end in the column direction.

4. The memory according to claim 2, which further comprises:
- a first bit line, a second bit line, and a third bit line respectively connected to the first recording layer, the second recording layer, and the third recording layer, and running in a column direction;
- a fourth bit line, a fifth bit line, and a sixth bit line respectively connected to the first fixed layer, the second fixed layer, and the third fixed layer, and running in the column direction;
- a fourth transistor, a fifth transistor, a sixth transistor, a seventh transistor, an eighth transistor, and a ninth transistor each having a current path whose one end is connected to a corresponding one of the first bit line, the second bit line, the third bit line, the fourth bit line, the fifth bit line, and the sixth bit line;
- a ground line connected to the other end of each of the current paths of the fifth transistor, the seventh transistor, and the ninth transistor, and having an end portion connected to the ground terminal;
- a first global data bus connected to the other end of the current path of the fourth transistor, and having an end portion connected to the first input;
- a second global data bus connected to the other end of each of the current paths of the sixth transistor and the eighth transistor, and having an end portion connected to the second input; and
- a first column selector controller connected to gates of the fourth transistor, the sixth transistor, and the eighth transistor; and
- a second column selector controller connected to gates of the fifth transistor, the seventh transistor, and the ninth transistor, and
- in which the ground line is arranged on an array end in the column direction different from that of the first global data bus and the second global data bus.

5. The memory according to claim 1, which further comprises:
- a first transistor having a first current path whose one end is connected to the first fixed layer;
- a second transistor having a second current path whose one end is connected to the second recording layer;
- a third transistor having a third current path whose one end is connected to the third fixed layer;
- a word line connected to gates of the first transistor, the second transistor, and the third transistor;
- a ground terminal connected to the other end of each of the first current path, the second current path, and the third current path; and
- a sense amplifier having a first input connected to the first recording layer, and a second input connected to the second fixed layer and the third recording layer, and
- in which when the read operation is performed, the current flows from the first reference element to the second transistor, and flows from the second reference element to the third transistor.

6. The memory according to claim 1, further comprising:
- a first bit line connected to the second recording layer, and running in a column direction;
- a second bit line connected to the third recording layer, running in the column direction, and placed on the same interconnection level as that of the first bit line;
- a third bit line connected to the second fixed layer, running in the column direction, and placed on an interconnection level different from that of the first bit line and the second bit line; and
- a fourth bit line connected to the third fixed layer, running in the column direction, and placed on the same interconnection level as that of the third bit line.

7. The memory according to claim 6, wherein one of the third bit line and the fourth bit line is placed between the first bit line and the second bit line in a row direction.

8. The memory according to claim 6, wherein the first bit line and the second bit line are placed between the third bit line and the fourth bit line in a row direction.

9. The memory according to claim 1, further comprising:
- a first bit line connected to the second fixed layer, and running in a column direction;
- a second bit line connected to the third recording layer, running in the column direction, and placed on an interconnection level different from that of the first bit line;
- a third bit line connected to the second recording layer, running in the column direction, and placed on the same interconnection level as that of the second bit line; and
- a fourth bit line connected to the third fixed layer, running in the column direction, and placed on the same interconnection level as that of the first bit line.

10. The memory according to claim 1, wherein
- a direction of the current flowing from the second fixed layer to the second recording layer is the same as a direction in which the antiparallel data is written in the first reference element, and
- a direction of the current flowing from the third recording layer to the third fixed layer is the same as a direction in which the parallel data is written in the second reference element.

11. The memory according to claim 1, wherein magnetization in the first fixed layer and the first recording layer is perpendicular to a film surface, magnetization in the second fixed layer and the second recording layer is perpendicular to a film surface, and magnetization in the third fixed layer and the third recording layer is perpendicular to a film surface.

12. A data read method of a magnetic random access memory including:

a memory element having a first fixed layer in which a magnetization direction is fixed, a first recording layer in which a magnetization direction changes in accordance with a direction of a write current, and a first nonmagnetic layer sandwiched between the first fixed layer and the first recording layer;

a first reference element having a second fixed layer in which a magnetization direction is fixed, a second recording layer in which a magnetization direction changes in accordance with a direction of a write current, and a second nonmagnetic layer sandwiched between the second fixed layer and the second recording layer, antiparallel data being written in the first reference element; and a second reference element making a pair with the first reference element, and having a third fixed layer in which a magnetization direction is fixed, a third recording layer in which a magnetization direction changes in accordance with a direction of a write current, and a third nonmagnetic layer sandwiched between the third fixed layer and the third recording layer, parallel data being written in the second reference element, comprising when a read operation is performed, flowing a current from the second fixed layer to the second recording layer in the first reference element, and flowing the current from the third recording layer to the third fixed layer in the second reference element, generating a reference signal for the memory element.

13. The method according to claim 12, wherein the memory further comprises:

a first transistor having a first current path whose one end is connected to the first fixed layer;

a second transistor having a second current path whose one end is connected to the second fixed layer;

a third transistor having a third current path whose one end is connected to the third fixed layer;

a word line connected to gates of the first transistor, the second transistor, and the third transistor;

a ground terminal connected to the other end of the first current path, the second recording layer, and the other end of the third current path; and a sense amplifier having a first input connected to the first recording layer, and a second input connected to the other end of the second current path and the third recording layer, and when the read operation is performed, the current flows from the second transistor to the first reference element, and flows from the second reference element to the third transistor.

14. The method according to claim 13, wherein the memory further comprises:

a first bit line, a second bit line, and a third bit line respectively connected to the first recording layer, the second recording layer, and the third recording layer, and running in a column direction;

a fourth bit line, a fifth bit line, and a sixth bit line respectively connected to the first fixed layer, the second fixed layer, and the third fixed layer, and running in the column direction;

a fourth transistor, a fifth transistor, a sixth transistor, a seventh transistor, an eighth transistor, and a ninth transistor each having a current path whose one end is connected to a corresponding one of the first bit line, the second bit line, the third bit line, the fourth bit line, the fifth bit line, and the sixth bit line;

a ground line connected to the other ends of the current paths of the fifth transistor, the seventh transistor, and the ninth transistor, and having an end portion connected to the ground terminal;

a first global data bus connected to the other end of the current path of the fourth transistor, and having an end portion connected to the first input;

a second global data bus connected to the other ends of the current paths of the sixth transistor and the eighth transistor, and having an end portion connected to the second input; and a column selector controller connected to gates of the fourth transistor, the fifth transistor, the sixth transistor, the seventh transistor, the eighth transistor, and the ninth transistor, and the current starts flowing from one end of an array in the column direction, and flows into the same end of the array.

15. The method according to claim 13, wherein the memory further comprises:

a first bit line, a second bit line, and a third bit line respectively connected to the first recording layer, the second recording layer, and the third recording layer, and running in a column direction;

a fourth bit line, a fifth bit line, and a sixth bit line respectively connected to the first fixed layer, the second fixed layer, and the third fixed layer, and running in the column direction;

a fourth transistor, a fifth transistor, a sixth transistor, a seventh transistor, an eighth transistor, and a ninth transistor each having a current path whose one end is connected to a corresponding one of the first bit line, the second bit line, the third bit line, the fourth bit line, the fifth bit line, and the sixth bit line;

a ground line connected to the other end of each of the current paths of the fifth transistor, the seventh transistor, and the ninth transistor, and having an end portion connected to the ground terminal;

a first global data bus connected to the other end of the current path of the fourth transistor, and having an end portion connected to the first input;

a second global data bus connected to the other end of each of the current paths of the sixth transistor and the eighth transistor, and having an end portion connected to the second input;

a first column selector controller connected to gates of the fourth transistor, the sixth transistor, and the eighth transistor; and a second column selector controller connected to gates of the fifth transistor, the seventh transistor, and the ninth transistor, and the current starts flowing from one end of an array in the column direction, and flows into the other end of the array in the column direction.

16. The method according to claim 12, wherein the memory further comprises:

a first transistor having a first current path whose one end is connected to the first fixed layer;

a second transistor having a second current path whose one end is connected to the second recording layer; and a third transistor having a third current path whose one end is connected to the third fixed layer, and when the read operation is performed, the current flows from the first reference element to the second transistor, and flows from the second reference element to the third transistor.

17. The method according to claim 12, wherein
a direction of the current flowing from the second fixed layer to the second recording layer is the same as a direction in which the antiparallel data is written in the first reference element, and
a direction of the current flowing from the third recording layer to the third fixed layer is the same as a direction in which the parallel data is written in the second reference element.

18. The method according to claim 12, wherein magnetization in the first fixed layer and the first recording layer is perpendicular to a film surface, magnetization in the second fixed layer and the second recording layer is perpendicular to a film surface, and magnetization in the third fixed layer and the third recording layer is perpendicular to a film surface.

19. A resistance random access memory comprising:
a memory element having a resistance which changes by a direction of an electric field between two terminals;
a first reference element having a resistance which changes by a direction of an electric field between two terminals, and in which high-resistance data is written;
a second reference element making a pair with the first reference element, having a resistance which changes by a direction of an electric field between two terminals, and in which low-resistance data is written; and
a current source which, when a read operation is performed, supplies a current to a direction in which the high-resistance data is written in the first reference element, and supplies the current to a direction in which the low-resistance data is written in the second reference element.

20. The memory according to claim 19, wherein
the memory element has a first lower electrode, a first upper electrode, and a first transition metal oxide layer sandwiched between the first lower electrode and the first upper electrode;
the first reference element has a second lower electrode, a second upper electrode, and a second transition metal oxide layer sandwiched between the second lower electrode and the second upper electrode;
the second reference element has a third lower electrode, a third upper electrode, and a third transition metal oxide layer sandwiched between the third lower electrode and the third upper electrode; and
when the read operation is performed, the current source supplies the current from the second lower electrode to the second upper electrode in the first reference element and supplies the electric current from the third upper electrode to the third lower electrode in the second reference element.

* * * * *